United States Patent [19]

Dijkmans et al.

[11] 4,317,128
[45] Feb. 23, 1982

[54] TWO TRANSISTOR SWITCH

[75] Inventors: Eise C. Dijkmans; Rudy J. van de Plassche, both of Eindhoven, Netherlands

[73] Assignee: U.S. Philips Corporation, New York, N.Y.

[21] Appl. No.: 135,943

[22] Filed: Mar. 31, 1980

[30] Foreign Application Priority Data

Apr. 4, 1979 [NL] Netherlands .......................... 7902632

[51] Int. Cl.³ .................................................. H01L 27/06
[52] U.S. Cl. ....................................... 357/46; 357/20; 357/51
[58] Field of Search ........................ 357/20, 46, 51, 22

[56] References Cited

U.S. PATENT DOCUMENTS

| | | | |
|---|---|---|---|
| 2,663,830 | 12/1953 | Oliver | 357/46 |
| 3,836,995 | 9/1974 | Wheatley et al. | 357/46 |
| 4,001,867 | 1/1977 | Kravitz et al. | 357/46 |

FOREIGN PATENT DOCUMENTS 2363897  3/1978  France ................................... 357/46

Primary Examiner—Richard A. Rosenberger
Attorney, Agent, or Firm—Thomas A. Briody; Robert T. Mayer; Steven R. Biren

[57] ABSTRACT

A Darlington transistor switch with a first and a second transistor, in which the base electrode of the first transistor is connected to the emitter electrode of the second transistor. In order to increase the switching speed of the device, the base-emitter capacitance of the second transistor relative to the base-emitter capacitance of the first transistor is increased so that voltage variations on the base of the second transistor with respect to the emitter of the first transistor are uniformly distributed over the base-emitter junctions of the two transistors.

2 Claims, 3 Drawing Figures

TWO TRANSISTOR SWITCH

BACKGROUND OF THE INVENTION

The invention relates to a transistor switch, comprising a first transistor whose collector-emitter current path constitutes the switching path, and a second transistor whose emitter electrode is connected to the base electrode of the first transistor and whose base electrode constitutes a switching input.

In such a switch the collector electrode of the second transistor is generally connected to that of the first transistor—a Darlington arrangement—which in comparison with a single transistor has the advantage that the loss of the signal current owing to the base currents is substantially smaller. In comparison with a single transistor, however, the transistor combination mentioned above is found to be substantially slower when employed as a switch.

SUMMARY OF THE INVENTION

It is the object of the invention to provide a switch of the type mentioned above with an improved switching speed and to this end the invention is characterized in that the total capacitance between the base and emitter of the second transistor relative to the capacitance of the base electrode of the first transistor is selected so that in the conductive state of the first and the second transistors a voltage variation on the base electrode of the second transistor relative to the voltage on the emitter electrode of the first transistor is distributed substantially uniformly over the base-emitter junctions of the first and the second transistor.

The invention is based on the recognition that in the customary Darlington transistor switches the stray capacitance between base and emitter of the second transistor is smaller than that between base and emitter of the first transistor, mainly because the second transistor carries only the base current of the first transistor, so that the current carried by the second transistor is substantially smaller that the current carried by the first transistor, as a result of which the current-dependent storage capacitance (storage capacitance) of the second transistor is smaller than that of the first transistor. Furthermore, because of its lower current level the second transistor can be dimensioned smaller than the first transistor, so that its depletion capacitance is also smaller. In addition, the collector-base capacitance of the first transistor, viewed from the emitter of the second transistor, acts in parallel with the base-emitter capacitance of the first transistor. During switching to the off state, this difference in the stray capacitance values causes a voltage variation on the base of the second transistor to appear initially across the base-emitter junction of the second transistor, turning off said transistor. After the second transistor has been turned off, the stray capacitances, which are connected to the base electrode of the first transistor, are included between the emitter of the cut-off second transistor and the base of the first transistor which is at a high-ohmic point, so that the discharge of said capacitances, which is accompanied by the turn-off of the first transistor, is effected far more slowly than in the case of a single-transistor switch whose base electrode is connected to a low-ohmic source of switching voltage.

The base-emitter capacitance of the second transistor may be increased in various manners, inter alia by connecting a capacitor, which may for example be constituted by a reverse-biased semiconductor junction, in parallel with said base-emitter junction. For increasing the capacitance, a preferred embodiment of the transistor switch in accordance with the invention is characterized in that the first and the second transistor are formed in a similar way in a single substrate and the area of the base-emitter junction of the second transistor is larger than the area of the base-emitter junction of the first transistor.

BRIEF DESCRIPTION OF THE DRAWING

The invention is described in more detail with reference to the Figures, in which.

DETAILED DESCRIPTION

Figure 1:
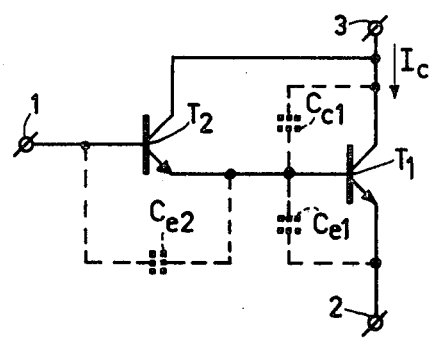
FIG. 1 shows a Darlington circuit arrangement.

FIG. 1 shows a Darlington arrangement of transistors $T_1$ and $T_2$, the emitter electrode of transistor $T_2$ being connected to the base electrode of transistor $T_1$ and the two collector electrodes being interconnected in a known manner. The emitter electrode of transistor $T_1$ is connected to a terminal 2 and the collector electrode to a terminal 3. The Darlington arrangement can function as a switch between terminals 2 and 3 by applying a suitable control signal to the terminal 1, which is connected to the base electrode of transistor $T_2$.

Each transistor exhibits a stray capacitance between its base and emitter, which capacitance comprises a depletion capacitance which is proportional to the area of the base-emitter junction and a charge storage capacitance, which is proportional to the collector current of the transistor. Since in a Darlington arrangement the control transistor $T_2$ carries a substantially smaller collector current than the output transistor $T_1$, the charge storage capacitance of the transistor $T_2$ is smaller than the charge storage capacitance of transistor $T_1$. As the emitter area the transistor $T_2$ may be selected to be smaller than that of transistor $T_1$ owing to the smaller current through transistor $T_2$, the depletion capacitance of transistor $T_2$ will also be smaller than that of transistor $T_1$, so that in the known Darlington configuration the base-emitter capacitance $C_{e2}$ of the control transistor $T_2$ will be smaller than the base-emitter capacitance $C_{e1}$ of transistor $T_1$. When transistors $T_1$ and $T_2$ conduct and the voltage between terminals 1 and 2 is then reduced so as to turn off the transistors, such a voltage decrease will be distributed over the capacitance $C_{e1}$ and $C_{e2}$ in parallel with the collector-base capacitance $C_{c1}$ of transistor $T_1$ and any other capacitances, such as a capacitance between the base of transistor $T_1$ and ground. As the capacitance $C_{e2}$ is smaller than the capacitance $C_{e1}$ in parallel with the capacitance $C_{c1}$, the greater part of the voltage decrease will initially appear across the capacitance $C_{e2}$, so that transistor $T_2$ is cut off before transistor $T_1$ is cut off, as a result of which the capacitances $C_{e1}$ and $C_{c1}$ are no longer connected to the emitter of transistor $T_2$, which is low-ohmic during conduction, and are thus discharged much more slowly than if that transistor $T_2$ were not cut off before transistor $T_1$. A solution is to increase the capacitance $C_{e2}$, so that a voltage variation between points 1 and 2 is equally distributed over the two base-emitter junctions and the two transistors are cut-off simultaneously, which is the optimum situation because the situation again deteriorates if the capacitance $C_{e2}$ is selected too high. In that case transistor $T_1$ is cut off first and transistor $T_2$ remains conductive unnecessarily long as a result of the capacitance $C_{e2}$ being too high, which inter alia results in an unnecessarily low threshold frequency $f_t$ of the control transistor. Moreover, the capacitance $C_{e1}$ is not further discharged via the base-emitter junction of transistor $T_1$ but via transistor $T_2$, so that capacitive charging current flows through terminal 3, transistor $T_1$ already being cut off.

Capacitance $C_{e2}$ may be increased, for example, by connecting an additional capacitance in parallel with the base-emitter junction of transistor $T_2$. In integrated circuits it is generally preferred to obtain said capacitance increase by increasing the area $A_2$ of the base-emitter junction of transistor $T_2$ relative to the area $A_1$ of the base-emitter junction of transistor $T_1$.

Figure 2:
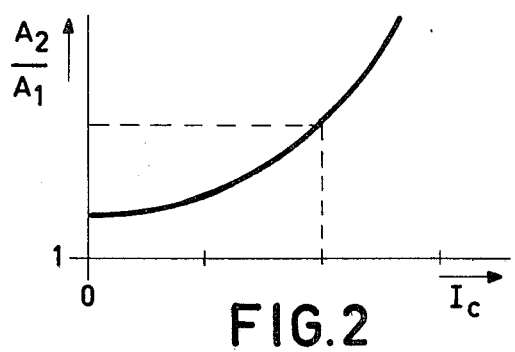
FIG. 2 graphically represents the optimum ratio of the areas of the base-emitter junctions of transistors $T_1$ and $T_2$.

FIG. 2 graphically represents the optimum ratio of the areas $A_1:A_2$ as a function of the current $I_c$ to be switched. This ratio increases as the current to be switched increases and is greater than unity even for very small currents $I_c$ because the capacitance $C_{e2}$ should be higher than the capacitance $C_{e1}$ as a result of the collector-base capacitance $C_{c1}$. Computations for Darlington arrangements integrated in accordance with conventional technologies have revealed that said area ratio may for example be three for switching currents of about 2 mA.

Figure 3:
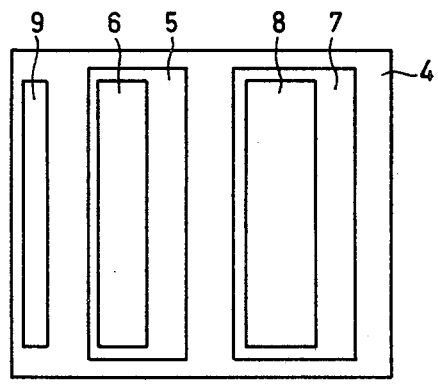
FIG. 3 shows an integrated-circuit embodiment of a transistor switch in accordance with the invention.

If for increasing the base-emitter capacitance of transistor $T_2$ relative to that of transistor $T_1$ it is decided to increase the area of the base-emitter junction of transistor $T_2$, this leads to the situation which is unusual for Darlington arrangements that the control transistor ($T_2$) has a larger base-emitter area than the output transistor $T_1$. FIG. 3 schematically represents such a solution, which is suitable for use in integrated circuits. In an n-type region 4 which functions as common collector for the two transistors, two p-type base regions 5 and 7 are formed. In the base region 5 an n-type emitter region 6 is formed and in the base-region 7 an n-type emitter region 8. In the collector region 4 an n+ diffusion 9 is formed, on which the common collector terminal 3 may be arranged. The regions 4, 5 and 6 constitute transistor $T_1$ and the regions 4, 7 and 8 transistor $T_2$. On the regions contacts are arranged in a known manner, for the sake of simplicity not shown in the Figure, which contacts are interconnected in accordance with the circuit diagram of FIG. 1. In order to obtain the desired area ratio the emitter 8 of transistor $T_2$ in wider than the emitter 6 of transistor $T_1$. Alternatively, in order to obtain the desired area ratio, the emitter 8 of transistor $T_2$ may be selected to be longer than the emitter 6 of transistor $T_1$.

The invention is not limited to the embodiment shown. There are different ways of obtaining said area ratio and there also exist possibilities other than enlarging the area in order to increase the capacitance $C_{e2}$. In addition, the invention may be applied in a similar way to Darlington combinations with pnp-transistors. Neither is the invention limited to a Darlington arrangement. If the accuracy of the switch is less important, the collector of transistor $T_2$ may alternatively be connected to, for example, a power supply terminal instead of to the collector of transistor $T_1$.

What is claimed is:

1. A transistor switch comprising a first transistor whose collector-emitter current path comprises the switching path and a second transistor, whose emitter electrode is connected to the base electrode of the first transistor and whose base electrode comprises a switching input, characterized in that the total capacitance between the base and the emitter of the second transistor relative to the capacitance at the base electrode of the first transistor is selected such that in the conductive state of the first and the second transistors a voltage variation on the base electrode of the second transistor relative to the voltage on the emitter electrode of the first transistor is distributed substantially uniformly over the base-emitter junctions of the first and the second transistors.

2. A transistor switch as claimed in claim 1, characterized in that the first and the second transistors are formed in a single substrate in a similar manner and that the area of the base-emitter junction of the second transistor is larger than the area of the base-emitter junction of the first transistor.

* * * * *